United States Patent
Wentzloff et al.

(10) Patent No.: US 9,020,456 B2
(45) Date of Patent: Apr. 28, 2015

(54) ULTRA-LOW-POWER RADIO FOR SHORT-RANGE COMMUNICATION

(71) Applicant: The Regents of the University of Michigan, Ann Arbor, MI (US)

(72) Inventors: David D. Wentzloff, Ann Arbor, MI (US); Nathan E. Roberts, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/915,749

(22) Filed: Jun. 12, 2013

(65) Prior Publication Data

US 2013/0331051 A1    Dec. 12, 2013

Related U.S. Application Data

(60) Provisional application No. 61/658,515, filed on Jun. 12, 2012.

(51) Int. Cl.
 *H04B 1/06*  (2006.01)
 *H04B 7/00*  (2006.01)
 *H04B 1/16*  (2006.01)

(52) U.S. Cl.
 CPC .................................... *H04B 1/1615* (2013.01)

(58) Field of Classification Search
 USPC ........... 455/230, 232.1, 234.1, 255–260, 313, 455/323, 334
 See application file for complete search history.

(56) References Cited

U.S. PATENT DOCUMENTS

| | | | |
|---|---|---|---|
| 6,384,540 B1* | 5/2002 | Porter et al. | ............. 315/111.51 |
| 7,720,513 B2 | 5/2010 | Enenkl | |
| 7,864,051 B2 | 1/2011 | Paradiso et al. | |
| 2010/0112950 A1 | 5/2010 | Haartsen et al. | |
| 2010/0216523 A1 | 8/2010 | Sebastiano et al. | |
| 2010/0231293 A1 | 9/2010 | Cho et al. | |
| 2010/0240319 A1 | 9/2010 | Matsuo | |
| 2010/0329387 A1 | 12/2010 | Watanabe | |
| 2011/0140851 A1 | 6/2011 | Lee et al. | |
| 2011/0202103 A1 | 8/2011 | Wikman et al. | |
| 2012/0112801 A1* | 5/2012 | Spits et al. | ..................... 327/109 |
| 2013/0281043 A1* | 10/2013 | Mu | ................ 455/311 |

FOREIGN PATENT DOCUMENTS

| | | |
|---|---|---|
| JP | 05-022172 | 1/1993 |
| KR | 2010-0019129 | 2/2010 |

OTHER PUBLICATIONS

S. Miller, et al., "A Nanowatt Bandgap Voltage Reference for Ultra-Low Power Applications", 0-7803-9390-2 IEEE (2006).

\* cited by examiner

*Primary Examiner* — Nhan Le
(74) *Attorney, Agent, or Firm* — Harness, Dickey & Pierce, P.L.C.

(57) ABSTRACT

A wake-up function is provided for a low power radio. The radio includes: an antenna, a rectifier, and a comparator. The rectifier is configured to receive an RF signal from the antenna and generates an output having a magnitude that decreases in the presence of the RF signal. The comparator compares the output from the rectifier to a reference signal and outputs an activation signal for another radio component. In response to the activation signal, the radio component will transition from a low power consumption mode to a higher power consumption mode. In this way, the rectifier and comparator cooperatively operate to perform a wake-up function in the presence of an RF signal.

20 Claims, 4 Drawing Sheets

ULTRA-LOW-POWER RADIO FOR SHORT-RANGE COMMUNICATION

CROSS-REFERENCE TO RELATED APPLICATIONS

This application claims the benefit of U.S. Provisional Application No. 61/658,515, filed on Jun. 12, 2012. The entire disclosure of the above application is incorporated herein by reference.

GOVERNMENT CLAUSE

This invention was made with government support under grant number CNS1035303 awarded by the National Science Foundation. The Government has certain rights in this invention.

FIELD

The present disclosure relates to a low power radio and, more particularly, to an improved rectifier for use in a low power radio.

BACKGROUND

Two important challenges leading to the ubiquitous use of wireless sensor nodes in body area networks (BAN) are small size and low power consumption. Radio power typically consumes the majority of the total power in a sensor node and therefore is a significant bottleneck in energy-efficient design. One technique used to reduce power consumption in a BAN is to use asynchronous communication that keeps the higher-power communication radio in a low-power sleep state. Radios, with power consumption as low as 50 µW, are a common technique used to achieve this. However, they are on at all times, and therefore contribute significantly to the total energy consumption of the node. Further power reduction is needed to improve sensor node lifetime to the point where it can be used without interruption in a BAN.

FIG. 1 shows a power vs. sensitivity comparison survey of published ultra-low power radios (top left) and energy harvesters (lower right) from 2005-2012. The plot is divided into two sections: 1) low-power radios that consume power, and 2) energy-harvesters that generate power.

Looking at the low power radio section, an empirical slope of −½ is apparent for radios with a sensitivity less than −60 dBm. This slope is influenced by several parameters, such as the variation in data rate, architecture, need for amplification at RF frequencies, and non-linearity present in the radios. The survey only covers ultra-low power receivers, common in BAN research; therefore, Bluetooth or Zigbee receivers with higher power will sit well above this line. A noticeable power floor around 50 µW is present, caused by a minimum power requirement for achieving gain at RF.

In the energy-harvester section, an empirical slope of −½ is also apparent in the data for sensitivity higher than −30 dBm. Below −30 dBm, received voltages are not sufficient to fully commutate the rectifier stages, and power-harvesting efficiency drops sharply.

When plotted together in FIG. 1, one can see a region below 50 µW and between −60 dBm to −36 dBm where communication does not exist. Obviously to the left and above this region radios have been demonstrated and to the right the received power is high enough that rectification could be used to communicate with zero power. The goal of this work is to explore this region, near the intersection of the extrapolated trend lines by targeting a radio with a sensitivity of −40 dBm and power consumption <1 µW.

Therefore, this disclosure presents a low power radio with an active area to address both of the challenges above while operating near the intersection of the extrapolated trend lines in FIG. 1. This section provides background information related to the present disclosure which is not necessarily prior art.

SUMMARY

This section provides a general summary of the disclosure, and is not a comprehensive disclosure of its full scope or all of its features.

A wake-up function is provided for a low power radio. The wake-up function is implemented by an antenna, a rectifier, and a comparator. The rectifier is configured to receive an RF signal from the antenna and generates an output having a magnitude that decreases in the presence of the RF signal. The comparator compares the output from the rectifier to a reference signal and outputs an activation signal for another radio component. In response to the activation signal, the radio component will transition from a low power consumption mode to a higher power consumption mode. In this way, the rectifier and comparator cooperatively operate to perform a wake-up function in the presence of an RF signal.

In one aspect of this disclosure, the rectifier is comprised generally of an active circuit, a replica bias circuit and an active feedback circuit. The active circuit includes a first active field effect transistor. The active circuit is configured to receive the RF signal and operates, in presence of an RF signal, to decrease voltage at a drain terminal of the first active field effect transistor. The replica bias circuit also includes a first bias field effect transistor that operates to output a constant voltage at a drain terminal of the first bias field effect transistor. The active feedback circuit has an input connected to a drain terminal of the first bias field effect transistor and an output connected to a gate terminal of both the first active field effect transistor and the first bias field effect transistor, wherein the active feedback circuit biases the first active field effect transistor to operate in a subthreshold region and biases the first bias field effect transistor to operate in a subthreshold region.

The active circuit can further include a second active field effect transistor and a second bias field effect transistor, where the second active field effect transistor has a source coupled to the drain of the first active field effect transistor and the second bias field effect transistor has a source coupled to the drain of the first bias field effect transistor.

The active feedback circuit may be defined as an operational amplifier having an inverting terminal connected to a drain terminal of the second field effect transistor, a non-inverting terminal connected a voltage reference circuit, and an output terminal connected to a gate terminal of both the first field effect transistor and the second field effect transistor.

The voltage reference circuit can be comprised generally of a cascode current mirror; a complementary to absolute temperature (CTAT) voltage generator; and a proportional to absolute temperature (PTAT) voltage generator. The CTAT voltage generator and the PTAT voltage generator are connected in series with each other and across an output of the cascode current mirror. Additionally, the CTAT voltage generator includes an upper field effect transistor and the PTAT voltage generator includes a lower field effect transistor, where the source terminal of the upper FET is coupled to a drain terminal of the lower FET. Of note, the gate of the upper field effect transistor is coupled to a gate of the lower field effect transistor.

In some embodiments, a filter is interposed between the antenna and the rectifier. The filter is configured to receive the RF signal from the antenna and output a signal in a specified frequency range.

In other embodiments, the radio component is further defined as a wireless transceiver or a controller residing in the housing of the radio.

Further areas of applicability will become apparent from the description provided herein. The description and specific examples in this summary are intended for purposes of illustration only and are not intended to limit the scope of the present disclosure.

DRAWINGS

Figure 1:
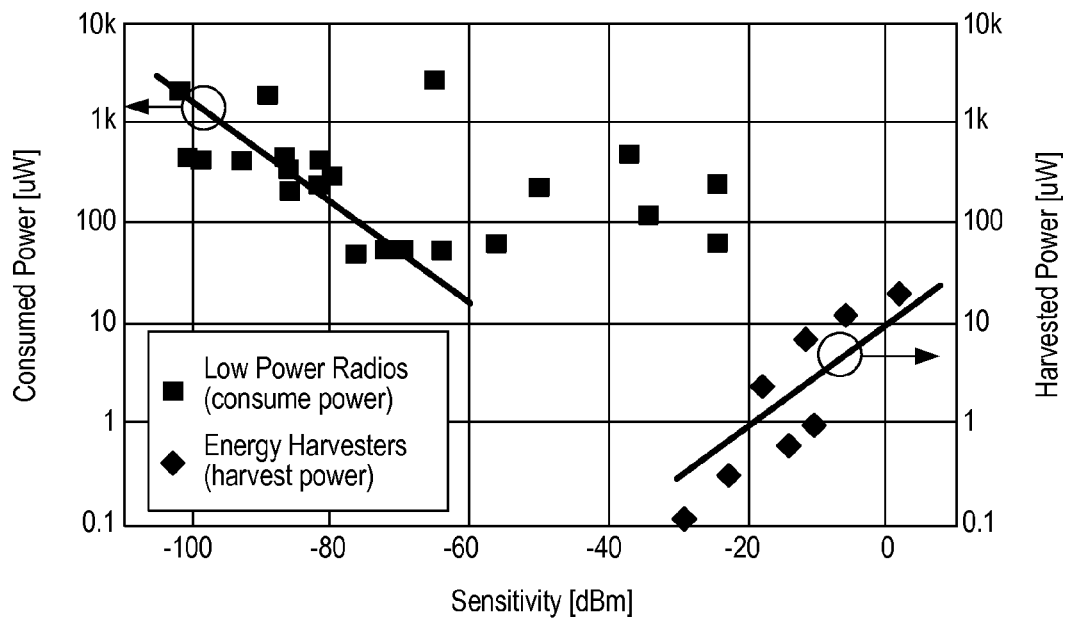
FIG. 1 is a chart illustrating a survey of low power and energy harvesters.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Example embodiments will now be described more fully with reference to the accompanying drawings.

Figure 2:
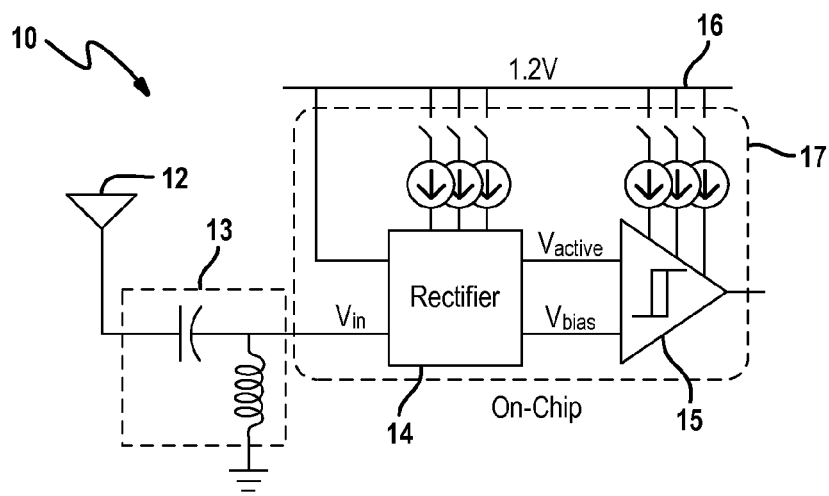
FIG. 2 is a block diagram of an exemplary architecture for a low power radio.

FIG. 2 depicts an exemplary arrangement for a low power radio 10. The radio 10 includes an antenna 12, a filter 13, a rectifier 14 and a comparator 15. The exemplary arrangement also includes a single external power supply 16, for example at 1.2V. In one embodiment, the rectifier 14 and comparator 15 are integrated onto a single chip 17. Both process and mismatch are compensated through calibration, which is implemented using a scan chain controlled by an off-chip FPGA but could also be one-time programmed using fuses. It is to be understood that only the relevant components of the radio are discussed in relation to FIG. 1, but that other components, such as a controller or an audio output, may be needed to construct an operational device. Other architectural arrangements for the radio are also contemplated within the broader aspects of this disclosure.

During operation, an RF signal is received at the antenna 12 and power matched by the filter 13 before it reaches the input to the rectifier 14. For a sensitivity of −40 dBm, the input signal at the antenna will be around 2.2 mV. The filter 13 operates to pass a signal in a specified frequency range. In an exemplary embodiment, the filter 13 is further defined as a resonant tank circuit. Because an input signal to the rectifier is desired to be as large as possible to maximize the rectifier's conversion gain, the resonant tank can be used at the input of the rectifier to boost the received voltage. Before implementing the resonant tank, the circuit's measured input impedance is 0.7-j18.8, so a 1 pF capacitor and 5.5 nH inductor was used in the resonant tank and increased the sensitivity of the wake-up radio by 12 dB.

The rectifier 14 generates an active output (Vactive) having a magnitude that decreases in the presence of an RF signal. The rectifier 14 also generates a replica bias output (Vbias) that remains constant, thereby acting as a bias point for the input to the comparator 15. The two output signals from the rectifier 14 feed into the comparator 15. The comparator 15 in turn compares the two input signals and generates a digital output. For example, the comparator 15 outputs an activation signal having a high value when the active signal is less than the bias signal and a low value when the active signal is greater than the bias signal.

The digital output of the comparator 15 can be used as an activation signal for another radio component. For example, the activation signal can be used to activate a controller, another radio transceiver (e.g., Bluetooth transceiver) or another radio component operating a low power consumption mode (e.g., a sleep mode). In response the activation signal, the radio component will transition from a low power consumption mode to a higher power consumption mode. In this way, the rectifier 14 and comparator 15 cooperatively operate to perform a wake-up function in the presence of an RF signal.

Figure 3:
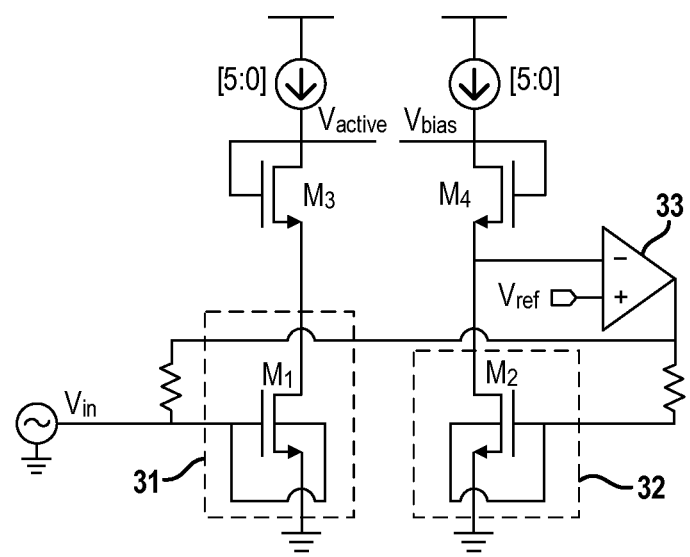
FIG. 3 is a schematic of an exemplary rectifier circuit.

FIG. 3 depicts an exemplary embodiment of a rectifier 14 for use in the low power radio 10. The rectifier 14 is comprised generally of an active circuit 31, a replica bias circuit 32 and an active feedback circuit 33. The active circuit 31 is configured to receive an RF signal and operates, in presence of an RF signal, to output a voltage that decreases in the presence of an RF signal. In the example embodiment, the active circuit 31 is comprised of a field effect transistor M1, where the active output is taken at a drain terminal of the field effect transistor. For example, the field effect transistor can be further defined as a self-biased triple-well NMOS device in weak inversion, controlled by a binary-weighted 6-bit current DAC. The NMOS device is configured as a DTMOS (gate connected to body), which decreases its subthreshold slope, increasing its conversion gain. The presence of a signal pulls the output low (Vactive).

In the example embodiment, the replica bias circuit 32 is also comprised of a field effect transistor M2 which operates to output a constant voltage at a drain terminal thereof. The field effect transistor M2 can be identical to the NMOS device used in the active circuit 31 although other types of transistors are contemplated by this disclosure.

Figure 5:
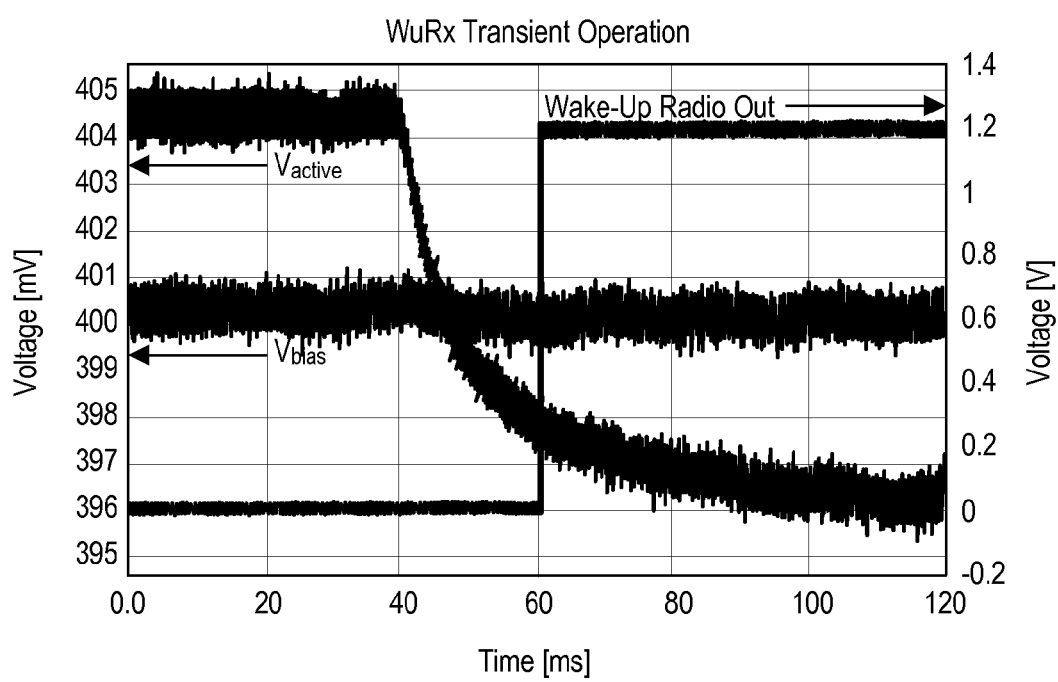
FIG. 5 is a graph illustrating waveforms output by the radio.

The active feedback circuit 33 operates to bias the active circuit 31 and the replica bias circuit 32. Specifically, the active feedback circuit biases the field effect transistors M1 and M2 to operate in a subthreshold region. In the example embodiment, the active feedback circuit 33 is an operational amplifier, where the inverting terminal is connected to a drain terminal of the field effect transistor in the replica bias circuit, the non-inverting terminal connected a voltage reference circuit, and the output terminal connected to a gate terminal of the field effect transistors in both the active circuit and the replica bias circuit. An active feedback amplifier 33 with one input connected to a nominal voltage reference equal to 2-3× the minimum overhead of the NMOS device M2 is used to self-bias the replica bias circuit 32 which then provides a DC bias to the active rectifier. In the presence of an RF signal, the rectifier device M1 quickly pulls down the drain voltage which then levels out as it enters the linear region as shown in FIG. 5, thereby allowing it to reset quickly when the signal disappears. Other implementations for the active feedback circuit are also contemplated by this disclosure.

Two additional transistors M3, M4 can be used to level shift the voltage at the drain of the rectifier to a voltage within the common-mode range of the comparator 15. In the example embodiment, one transistor M3 has its source terminal coupled to the drain terminal of the field effect transistor M1 in the active circuit 31; whereas, the other transistor M4 has a source terminal coupled to the drain terminal of the field effect transistor M2 in the replica bias circuit 32.

Figure 4:
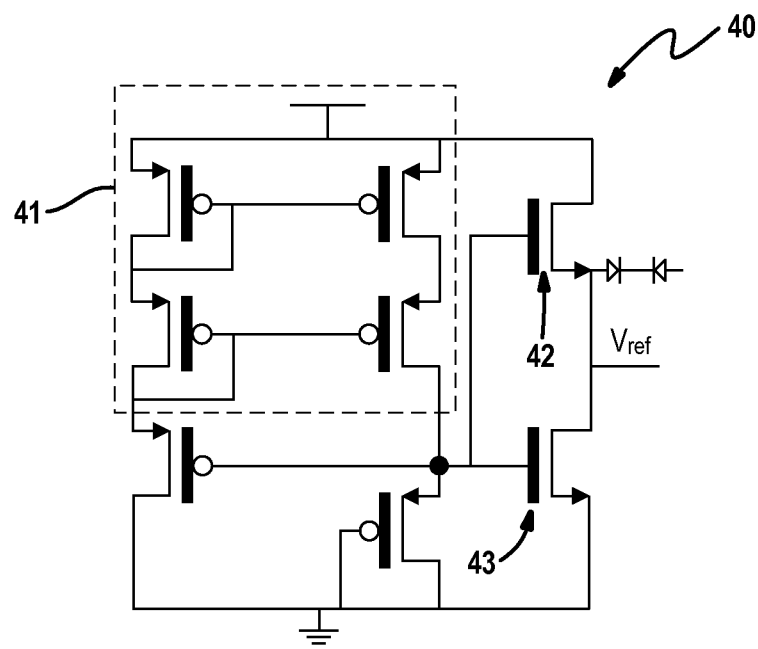
FIG. 4 is a schematic of an exemplary on-chip voltage reference circuit.

FIG. 4 illustrates an example voltage reference circuit 40 which may be used with the rectifier 14. The voltage reference circuit 40 was designed to have a reasonably stable voltage output at very low power levels. In one embodiment, the voltage reference circuit 40 is comprised generally of a cascode current mirror 41; a complementary to absolute temperature (CTAT) voltage generator 42; and a proportional to absolute temperature (PTAT) voltage generator 43. The CTAT voltage generator 42 and the PTAT voltage generator 43 are connected in series with each other and across an output of the cascode current mirror 41. In an example embodiment, the CTAT voltage generator 42 is implemented by an upper field effect transistor and the PTAT voltage generator 43 is implemented by a lower field effect transistor, where the source terminal of the upper FET is coupled to a drain terminal of the lower FET. Of note, the gate of the upper field effect transistor is coupled to a gate of the lower field effect transistor. Without connecting the gate of the upper field effect transistor to the gate of the lower field effect transistor (and instead tying it to VDD), the upper FET would be too strong and pull the output voltage reference higher than desired for the rectifier circuit. Connecting its gate to the gate of the lower FET reduces its strength and allows the voltage output to be lower and within the range needed to properly operate the rectifier. This is acceptable because the absolute voltage output performance and stability is not as critical as the low power performance of the voltage reference. Other voltage reference circuits also fall within the broader aspects of this disclosure.

In operation, the rectifier functions like an inverter. The pull-up portion of the inverter is the current DAC which is constantly pulling up on M1. M1 is the pull-down portion of the inverter and is biased by the feedback amplifier to hold the output between the two steady. When a signal is present, the exponential behavior of the weak inversion rectifier will cause the pull-down to become much stronger and pull the output low. Since the rectifier is biased so that the drain voltage is only 2-3× its minimum headroom, it very quickly levels out. At this point, the output has fallen enough to toggle the comparator output. When the input signal is removed, the pull-up will restore the balance between it and the pull-down.

In the exemplary embodiment, a hysteretic comparator with tunable asymmetry is used to compare the output of the rectifier. The comparator uses a 4-bit binary-weighted calibration scheme to determine the amount of hysteresis. Calibration is performed using parallel tail devices on each side of the comparator. Binary switching among the four devices on each side changes their effective width, and therefore the input offset. The common mode input voltage ranges from 300 mV to 600 mV and the hysteresis ranges from −31 mV to +29 mV. Power is controlled across process variation using a 7-bit binary-weighted current DAC, similar to the one used in the rectifier, and thick oxide devices are used to reduce power consumption and device leakage. It is envisioned that the radio may employ other types of components to compare and otherwise process output from the rectifier.

Mismatch is exaggerated in designs using devices in weak inversion so several steps have been taken to reduce the effects mismatch has on performance. Mismatch will be most prominent in the relative voltage levels at the output of the active rectifier and replica bias circuits.

Nominal operation for the rectifier uses a single feedback amplifier, with its input connected to the bias device's drain voltage, to control gate biasing for both the active rectifier and replica bias. This will cause both devices to be biased to the same gate voltage and, without mismatch, would produce equal drain voltages. However, due to mismatch the drain voltages will differ and to compensate for this effect, the programmable hysteresis in the comparator can calibrate out the difference between the active and bias outputs.

If the offset between the output of the active and bias devices in the rectifier is significant enough, a second feedback amplifier can be used so the active and replica bias devices can be independently biased. Each active feedback element will have the same on-chip voltage reference input to pull their drain voltages close. Since the voltage is shared between the active and bias rectifiers, exact PVT insensitive voltage levels are not required. The feedback amplifier has a slow enough response time to keep the bias level steady in the presence of the OOK input signal. The drawback to this approach is that it doubles the total power consumption from the feedback amplifiers and sensitivity is reduced.

In some embodiments, the low power radio has been designed with a low-power sleep mode to support a duty-cycled wake-up strategy. This places extra emphasis on the importance of energy consumption in the sleep mode. To improve sleep mode energy, thick-oxide power gating devices were used throughout the design with the above minimum lengths.

In an exemplary implementation, the low power radio was fabricated in 0.13 μm CMOS and operates under a single 1.2V power supply. The active area of the low power radio is 156×190 μm2. Without test circuits, the low power radio uses 5 IO pins.

A 915 MHz signal with −41 dBm sensitivity was connected directly to the receiver input and the signal output was monitored on an oscilloscope. The signal is OOK modulated at a data rate of 100 kbps. FIG. 5 shows the transient operation of the low power radio running at 98 nW total power. Communication using patch antennas was also verified at a distance of 4 ft using a transmit power of 0 dBm, which is roughly half the theoretical communication distance of 8.5 ft based on the Friis equation.

Figure 6A:
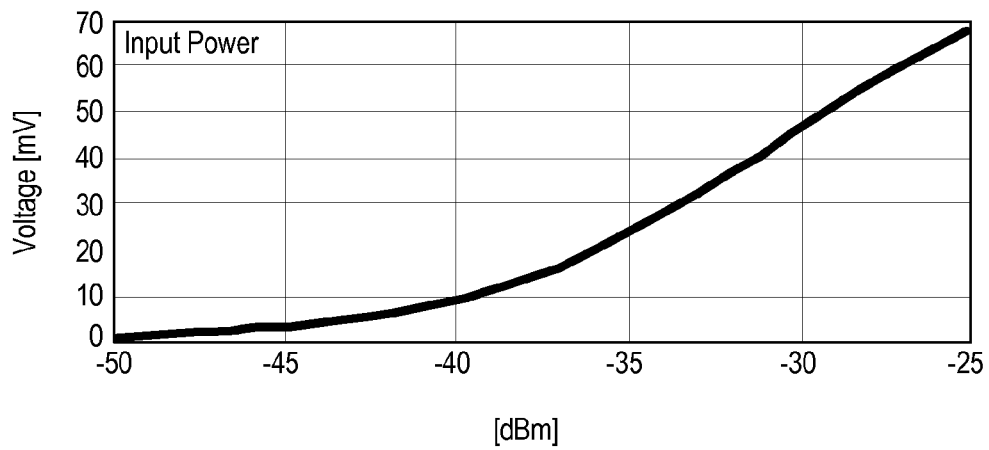
FIGS. 6A and 6B are graphs depicting output voltage at the comparator of the low power radio as a function of input power and frequency, respectively.
Figure 6B:
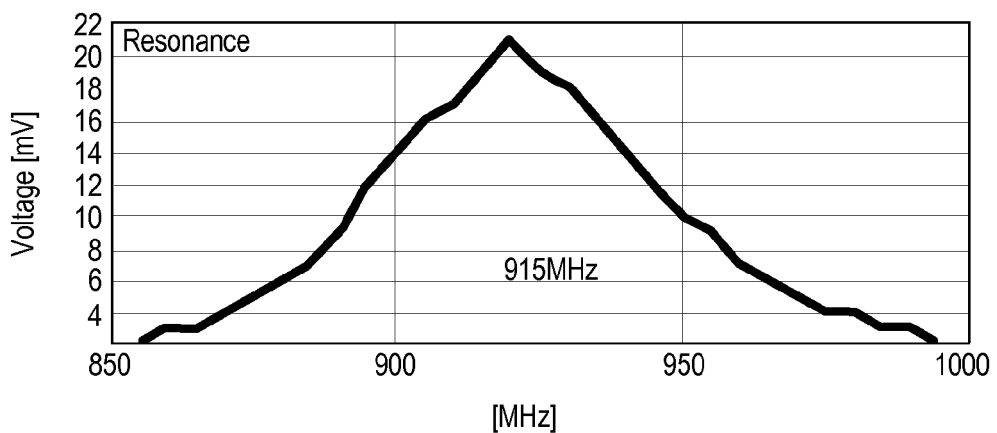

FIGS. 6A and 6B show the measured output voltage of the rectifier as a function of input amplitude and frequency, respectively. FIG. 6A shows reduced output voltage amplitude at lower input sensitivity. With higher input, the conversion gain improves which allows for potential power savings. For example, at −30 dBm, the power consumption of the wake-up radio can be reduced to 53 nW. FIG. 6B shows output voltage vs. frequency due to the off-chip resonant tank. The data was taken with an input power of −36 dBm and shows peak resonance at 920 MHz, but sufficient performance at 915 MHz.

| | Power (nW) | | Min | Max |
|---|---|---|---|---|
| Bias Circuits | 20 nW | Hysteresis Calibration | −31 mV | +29 mV |
| Rectifier | 23 nW | Hysteresis Resolution | 2 mV | |
| Replica Bias | 23 nW | Current DAC Resolution | 1.4 nA | |
| Feedback Amplifiers | 4 nW | On-chip Voltage Ref startup time | 110 μs | |
| Comparator | 28 nW | | | |
| TOTAL | 98 nW | Sleep Power | 11 pW | |

Table 1 above shows a power breakdown of the low power radio under the same conditions as FIG. 5. The entire radio consumed a total of 98 nW with a measured sleep power of 11 pW. The right side of the table shows the calibration setting resolution as well as the startup time from sleep for the on-chip voltage reference used in the feedback amplifier.

|  | This Work | [1] | [2] | [3] |
| --- | --- | --- | --- | --- |
| Power | 98 nW | 51 uW | 52 uW | 500 uW |
| Frequency | 915 MHz | 915 MHz | 2 GHz | 916.5 MHz |
| Data-rate | 100 kbps | 100 kbps | 100 kbps | 1 Mbps |
| Energy/bit | 0.98 pJ/bit | 510 pJ/bit | 520 pJ/bit | 500 pJ/bit |
| Sensitivity | −41 dBm | −75 dBm | −72 dBm | −37 dBm |
| Die Area | 0.3 mm² | 0.36 mm² | 0.1 mm² | 1.82 mm² |
| VDD | 1.2 V | 0.5 V | 0.5 V | 1.4 V |
| Process | 0.13 μm CMOS | 90 nm CMOS | 90 nm CMOS | 0.18 μm CMOS |

Table 2 above shows a comparison with other low power radios. It can be seen that reducing the sensitivity allows for much lower power radio design as well as more energy efficient communication. Sensitivity levels around −40 dBm are acceptable for many applications in body area networks.

A low power radio designed in 0.13 μm CMOS was presented. By avoiding the need to generate transconductance at RF, power of the radio can be reduced beyond the surveyed 50 μW power floor. Using this methodology a 98 nW wake-up radio with a −41 dBm sensitivity and 100 kpbs data rate was achieved.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An improved rectifier for use in a low power radio, comprising:
    an active circuit including a first active field effect transistor, the active circuit configured to receive an RF signal and operates, in presence of an RF signal, to decrease voltage at a drain terminal of the first active field effect transistor;
    a replica bias circuit, including a first bias field effect transistor, that operates to output a constant voltage at a drain terminal of the first bias field effect transistor; and
    an active feedback circuit having an input connected to a drain terminal of the first bias field effect transistor and an output connected to a gate terminal of both the first active field effect transistor and the first bias field effect transistor, wherein the active feedback circuit biases the first active field effect transistor to operate in a subthreshold region and biases the first bias field effect transistor to operate in a subthreshold region.

2. The rectifier of claim 1 wherein the active circuit further includes a second active field effect transistor and a second bias field effect transistor, the second active field effect transistor having a source coupled to the drain of the first active field effect transistor and the second bias field effect transistor having a source coupled to the drain of the first bias field effect transistor.

3. The rectifier of claim 1 at least one of the first active field effect transistor and the first bias field effect transistor is further defined as a metal-oxide semiconductor field effect transistor.

4. The rectifier of claim 1 wherein the active feedback circuit further comprises an operational amplifier having an inverting terminal connected to a drain terminal of the second field effect transistor, a non-inverting terminal connected a voltage reference circuit, and an output terminal connected to a gate terminal of both the first field effect transistor and the second field effect transistor.

5. The rectifier of claim 1 wherein the voltage reference circuit includes
    a cascode current mirror;
    a complementary to absolute temperature voltage generator comprised of an upper field effect transistor; and
    a proportional to absolute temperature voltage generator comprised of a lower field effect transistor, the upper field effect transistor and the lower field effect transistor are connected across an output of the cascode current mirror, such that a source of the upper field effect transistor is coupled to a drain of the lower field effect transistor and a gate of the upper field effect transistor is coupled to a gate of the lower field effect transistor.

6. The rectifier of claim 1 wherein the active circuit outputs a signal for use by a radio.

7. The rectifier of claim 6 wherein the radio includes:
    an antenna configured to receive an RF signal, wherein the rectifier operates to generate an active output signal;
    a comparator configured to receive the active output signal and a bias signal and operates to compare the active output signal to the bias signal, where the comparator outputs an activate signal having a high value when the active output signal is less than the bias signal and a low value when the active output signal is greater than the bias signal;
    a radio component configured to receive the activate signal from the comparator while operating in a low power consumption mode, the radio component transitions from a low power consumption mode to a high power consumption mode in response to receiving the activate signal with a high value.

8. The rectifier of claim 7 further comprises a filter configured to receive the RF signal from the antenna and output an input signal in a specified frequency range.

9. The rectifier of claim 7 wherein the radio component is further defined as a wireless transceiver or a controller residing in a housing of the radio.

10. The rectifier of claim 1 wherein the active circuit outputs a signal for use by a discrete integrated circuit.

11. A rectifier, comprising:
    an active circuit having a first active field effect transistor, the active circuit configured to receive an RF signal and operates, in presence of an RF signal, to decrease voltage at a drain terminal of the first active field effect transistor; and
    an active feedback circuit having an output connected to a gate terminal of the first active field effect transistor and operates to bias the first active field effect transistor to operate in a subthreshold region.

12. The rectifier of claim 11 further comprises a replica bias circuit having a first bias field effect transistor and operates to output a constant voltage at a drain terminal of the first bias field effect transistor, wherein the active feedback circuit having an input connected to a drain terminal of the first bias field effect transistor and an output connected to a gate terminal of both the first active field effect transistor and the first bias field effect transistor, such that the active feedback circuit biases the first bias field effect transistor to operate in a subthreshold region.

13. The rectifier of claim 12 wherein the active circuit further includes a second active field effect transistor and a second bias field effect transistor, the second active field effect transistor having a source coupled to the drain of the first active field effect transistor and the second bias field effect transistor having a source coupled to the drain of the first bias field effect transistor.

14. The rectifier of claim 13 wherein at least one of the first active field effect transistor and the first bias field effect transistor is further defined as a metal-oxide semiconductor field effect transistor.

15. The rectifier of claim 14 wherein the active feedback circuit further comprises an operational amplifier having an inverting terminal connected to a drain terminal of the second field effect transistor, a non-inverting terminal connected to a voltage reference circuit, and an output terminal connected to a gate terminal of both the first field effect transistor and the second field effect transistor.

16. The rectifier of claim 15 wherein the voltage reference circuit includes
   a cascode current mirror;
   a complementary to absolute temperature voltage generator comprised of an upper field effect transistor; and
   a proportional to absolute temperature voltage generator comprised of a lower field effect transistor, the upper field effect transistor and the lower field effect transistor are connected across an output of the cascode current mirror, such that a source of the upper field effect transistor is coupled to a drain of the lower field effect transistor and a gate of the upper field effect transistor is coupled to a gate of the lower field effect transistor.

17. The rectifier of claim 11 wherein the active circuit outputs a signal for use by a radio.

18. The rectifier of claim 17 wherein the radio includes:
   an antenna configured to receive an RF signal, wherein the rectifier operates to generate an active output signal;
   a comparator configured to receive the active output signal and a bias signal and operates to compare the active output signal to the bias signal, where the comparator outputs an activate signal having a high value when the active output signal is less than the bias signal and a low value when the active output signal is greater than the bias signal;
   a radio component configured to receive the activate signal from the comparator while operating in a low power consumption mode, the radio component transitions from a low power consumption mode to a high power consumption mode in response to receiving the activate signal with a high value.

19. The rectifier of claim 18 further comprises a filter configured to receive the RF signal from the antenna and output an input signal in a specified frequency range.

20. The rectifier of claim 18 wherein the radio component is further defined as a wireless transceiver or a controller residing in a housing of the radio.

* * * * *